(12) United States Patent
Pyo et al.

(10) Patent No.: US 11,139,012 B2
(45) Date of Patent: Oct. 5, 2021

(54) RESISTIVE MEMORY DEVICE HAVING READ CURRENTS FOR A MEMORY CELL AND A REFERENCE CELL IN OPPOSITE DIRECTIONS

(71) Applicant: Samsung Electronics Co., Ltd., Suwon-si (KR)

(72) Inventors: Suk-Soo Pyo, Hwaseong-si (KR); Hyun Taek Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/814,678

(22) Filed: Mar. 10, 2020

(65) Prior Publication Data

US 2020/0312396 A1    Oct. 1, 2020

(30) Foreign Application Priority Data

Mar. 28, 2019    (KR) .................. 10-2019-0035852
Sep. 5, 2019    (KR) .................. 10-2019-0109958

(51) Int. Cl.
*G11C 11/16*    (2006.01)
*H01L 43/02*    (2006.01)
*H01L 27/22*    (2006.01)

(52) U.S. Cl.
CPC ........ *G11C 11/1673* (2013.01); *G11C 11/161* (2013.01); *H01L 27/228* (2013.01); *H01L 43/02* (2013.01)

(58) Field of Classification Search
CPC . G11C 11/1673; G11C 11/161; G11C 11/165; H01L 43/02; H01L 27/228
See application file for complete search history.

(56) References Cited

U.S. PATENT DOCUMENTS

| | | |
|---|---|---|
| 8,059,480 B2 | 11/2011 | Lee et al. |
| 8,194,439 B2 | 6/2012 | Kim et al. |
| 8,570,797 B2 | 10/2013 | Kim et al. |
| 8,687,412 B2 | 4/2014 | Chih et al. |
| 9,343,129 B2 | 5/2016 | Shimomura |
| 9,524,766 B2 | 12/2016 | Mueller et al. |
| 10,163,478 B2* | 12/2018 | Jung ................. H01L 43/08 |
| 2004/0008556 A1* | 1/2004 | Hidaka ............... G11C 11/16 365/210.12 |
| 2004/0160811 A1* | 8/2004 | Tsuchida ............. G11C 11/15 365/158 |
| 2009/0067212 A1* | 3/2009 | Shimizu .............. B82Y 10/00 365/148 |

(Continued)

FOREIGN PATENT DOCUMENTS

WO    2010138160 A1    12/2010

*Primary Examiner* — Mushfique Siddique
(74) *Attorney, Agent, or Firm* — Muir Patent Law, PLLC

(57) ABSTRACT

A nonvolatile memory device includes a memory cell comprising a first variable resistor having one end connected to a first node, and the other end connected to a second node through a cell transistor; and a reference cell comprising a second variable resistor having one end connected to a third node, and the other end connected to a fourth node through a reference cell transistor, wherein gates of the cell transistor and the reference cell transistor are connected to a word line. Directions of a first read current flowing in the memory cell and a direction of a second read current flowing in the reference cell are opposite to each other.

17 Claims, 12 Drawing Sheets

(56) References Cited

U.S. PATENT DOCUMENTS

2018/0137913 A1* 5/2018 Kim ................... G11C 13/004
2018/0301178 A1* 10/2018 Kim ................... G11C 11/1697
2019/0088299 A1* 3/2019 Antonyan ............. H01L 27/228
2019/0088328 A1* 3/2019 Antonyan .............. G11C 7/067
2019/0348118 A1* 11/2019 Antonyan ............... G11C 11/15

* cited by examiner

RESISTIVE MEMORY DEVICE HAVING READ CURRENTS FOR A MEMORY CELL AND A REFERENCE CELL IN OPPOSITE DIRECTIONS

This application claims priority under 35 U.S.C. § 119 to Korean Patent Application No. 10-2019-0035852 filed Mar. 28, 2019 and Korean Patent Application No. 10-2019-0109958 filed Sep. 5, 2019, the disclosure of each of these applications being hereby incorporated herein by reference.

BACKGROUND

1. Technical Field

The present disclosure relates to a nonvolatile memory device, and particularly, to a resistive memory device.

2. Description of the Related Art

A resistive memory device records data on a memory cell including a variable resistor element. To read data recorded in the memory cell, a read current $I_{READ}$ may be provided to the memory cell. In addition, the read current $I_{READ}$ may be provided to a reference cell on which reference data is recorded in order to sense memory cell data.

It is important to set a stable reference level for the reference cell in order to successfully read the memory cell data. However, the reference cell may have a structure connected to a plurality of memory cells, that is, normal memory cells. Since the number of times the reference cell of this structure is accessed is larger than the number of times the normal memory cells are accessed, the reference cell may receive a high read stress, and as a result, stability of the reference cell may be degraded and there may be a problem that a read disturb rate (RDR) increases. Accordingly, there is a demand for a method for improving a stable reference level in the situation described above.

SUMMARY

A technical objective to be achieved by the present disclosure is to provide a resistive memory which can reduce an RDR for a reference cell receiving a high read stress, and can improve a sensing margin.

According to some embodiments of the present inventive concept, a nonvolatile memory device comprises a first series connection of a first variable resistor element and a cell transistor; a reference cell comprising a second series connection of a second variable resistor element and a reference cell transistor; a first current source configured to provide a first read current to the memory cell; a second current source configured to provide a second read current to the reference cell; and a first word line, where gates of the cell transistor and the reference cell transistor are connected to the first word line. The first current source and the second current source may be configured to provide the first read current and the second read current in directions that are opposite to each other with respect to the first word line.

According to some embodiments the first variable resistor element has one end connected to a first bit line, and the other end connected to a first source line through a cell transistor; and the second variable resistor element has one end connected to a second bit line, and the other end connected to a second source line through a reference cell transistor. In some embodiments, the first read current flows through the memory cell from the first source line to the first bit line, and the second read current flows through the reference cell from the second bit line to the second source line. In some embodiments, the first read current flows through the memory cell from the first bit line to the first source line, and the second read current flows through the reference cell from the second source line to the second bit line.

The technical objectives that are intended to be addressed by the present disclosure are not limited to that mentioned above, and other technical objectives that are not mentioned above can be clearly understood to those skilled in the art based on the description provided below.

DETAILED DESCRIPTION

Hereinafter, various embodiments of the present disclosure will be described with reference to the accompanying drawings.

Figure 1:
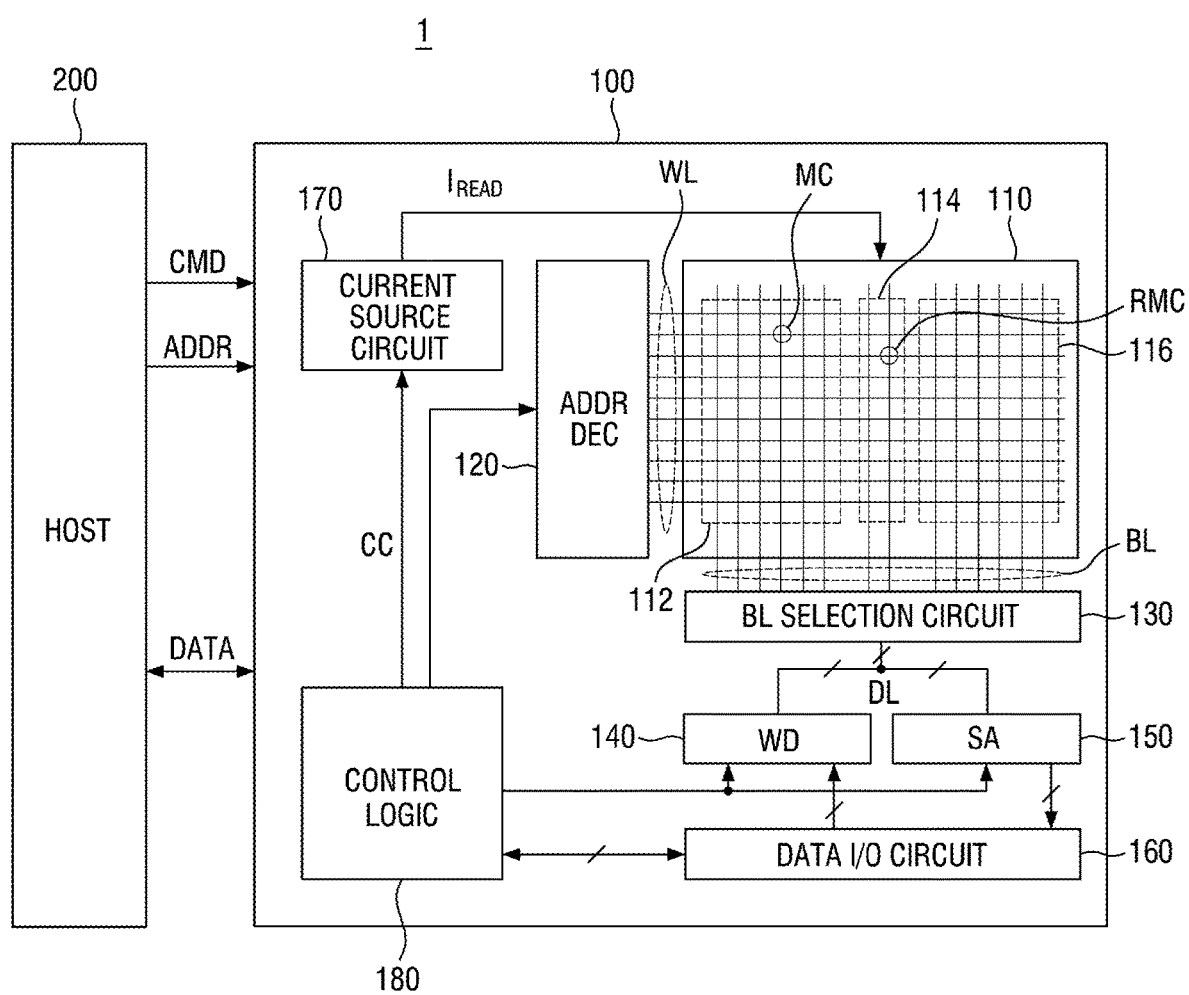
FIG. 1 is a block diagram a nonvolatile memory device according to an embodiment of the present disclosure.

FIG. 1 is a block diagram a nonvolatile memory device according to an embodiment of the present invention.

Referring to FIG. 1, the nonvolatile memory device 100 according to an embodiment may read or write data according to a request of a host 200. The nonvolatile memory device 100 may be an integrated circuit (i.e., a semiconductor chip). The host 200 may be a memory controller (e.g., another integrated circuit/semiconductor chip) or a computer, for example.

Specifically, the nonvolatile memory device 100 may receive a command CMD and an address ADDR from the host 200 from a bus interconnecting the nonvolatile memory device 100 and the host 200. The command CMD may be a read command, a write command, etc. When the host 200 transmits a read command to the nonvolatile memory device 100, the nonvolatile memory device 100 may provide data DATA read from a memory cell array 110 to the host 200.

When the host 200 transmits a write command and data DATA to be written to the nonvolatile memory device 100, the nonvolatile memory device 100 may write in response thereto the data DATA provided from the host 200 in the memory cell array 110.

The nonvolatile memory device 100 may include the memory cell array 110, an address decoder circuit 120 (i.e., a row address decoder and a column address decoder), a bit line selection circuit 130, a write driver circuit 140 (i.e., an array of write drivers), a sensing amplification circuit 150 (i.e., a sense amplifier array of a plurality of sense amplifiers), a data input and output circuit 160, a current source circuit 170, and a control logic circuit 180 (i.e., control logic). The above-described configuration is merely an example, and some components may be omitted and/or new components may be added according to a specific purpose of implementing.

The memory cell array 110 may include a plurality of nonvolatile memory cells MC to store data. Each memory cell MC may include a variable resistor element having a resistance value according to a value of data stored therein, for example, as stored in a magnetic tunnel junction (MTJ) structure.

In some embodiments, the nonvolatile memory device 100 may be referred to as a resistive memory device, a resistive random access memory (RRAM) (or ReRAM) device. For example, the memory cell array 110 of the nonvolatile memory device 100 may include a structure like a phase change random access memory (PRAM), a ferroelectric random access memory (FRAM), or the like, and may include a magnetic random access memory (MRAM) structure such as a spin-transfer torque magnetic random access memory (STT-MRAM), a spin torque transfer magnetization switching RAM (Spin-RAM), and a spin momentum transfer (SMT)-RAM. Hereinafter, various embodiments according to the present disclosure will be described mainly with reference to an MRAM, but the scope of the present invention is not limited thereto, and should be understood to be equally applicable to these other memory device types.

The memory cell array 110 may include normal memory cell regions 112, 116 and a reference cell region 114. Although two normal memory cell regions and one reference cell region are illustrated, different numbers of normal memory cell regions and reference cell regions may be implemented.

The normal memory cell regions 112, 116 may include one or more normal memory cells MC in which data is recorded. Specifically, the normal memory cell regions 112, 116 may include normal memory cells MC arranged in rows corresponding to a plurality of word lines WL and arranged in columns corresponding to a plurality of bit lines BL. In this description, reference to a "memory cell" as a "normal memory cell" may be used to distinguish such memory cells from a "reference cell," which will be described later, and the phrases "memory cell" and the "normal memory cell" may be used to refer to the same component (unless context indicates otherwise).

The reference cell region 114 may include one or more reference cells RMC used to determine a value of data recorded in the normal memory cells MC. Specifically, the reference cell region 114 may include reference cells RMC arranged in rows corresponding to the plurality of word lines WL. The reference cells RMC may be arranged in columns corresponding to some of the plurality of bit lines BL that are electrically connected only to the reference cells RMC. In the detailed description, the phrases "reference cell" may also be referred to as a "reference memory cell," and the "reference cell" and the "reference memory cell" may be used to indicate the same component.

In the present embodiment, the reference cell region 114 may be arranged between the first normal memory cell region 112 and the second normal memory cell region 116. However, the scope of the present invention is not limited hereto.

The address decoder circuit 120 may receive an input of an address ADDR including a row address and a column address and decode the same. The address decoder circuit 120 may select (e.g., activate) one word line from the plurality of word lines WL according to the row address. In addition, the address decoder circuit 120 may decode the column address and to control to the bit line selection circuit 130 to select one or more bit lines corresponding column address. For example, the address decoder 120 may include components like a row decoder, a column decoder, an address buffer, or the like. It should be appreciated that representation of the address decoder 120 is simplified and location of the row decoder, column decoder and address buffer may be spaced apart from each other and located other than shown (e.g., as conventional).

The bit line selection circuit 130 may be connected to the memory cell array 110 through bit lines, and may be connected to the write driver circuit 140 and the sensing amplification circuit 150. The bit line selection circuit 130 may operate in response to control of the control logic 180. The bit line selection circuit 130 may be configured to receive a selection signal from the address decoder circuit 120 corresponding to the column address decoded by the address decoder circuit 120.

In addition, the bit line selection circuit 130 may select one or a set of bit lines corresponding to the decoded column address in response to the selection signal received from the address decoder circuit 120. For example, in a writing operation, the bit line selection circuit 130 may connect the selected bit lines to data lines DL, thereby connecting the selected bit lines to the write driver circuit 140 (e.g., each one of the selected bit lines being connected to a corresponding write driver of the write driver circuit 140). In a read operation, the bit line selection circuit 130 may connect the selected bit lines to the sensing amplification circuit 150 (e.g., each one of the selected bit lines being connected to a corresponding sense amplifier of sensing amplification circuit 150).

The write driver circuit 140 may operate according to control of the control logic 180. The write driver circuit 140 may program memory cells MC which are connected both to the bit lines selected by the bit line selection circuit 130, and to the word line selected by the address decoder circuit 120. The each write driver of the write driver circuit 140 may generate a current or voltage according to a corresponding bit of data of the data inputted from the data input and output circuit 160, and may output the current or voltage to a corresponding one of the selected bit lines.

Figure 8:
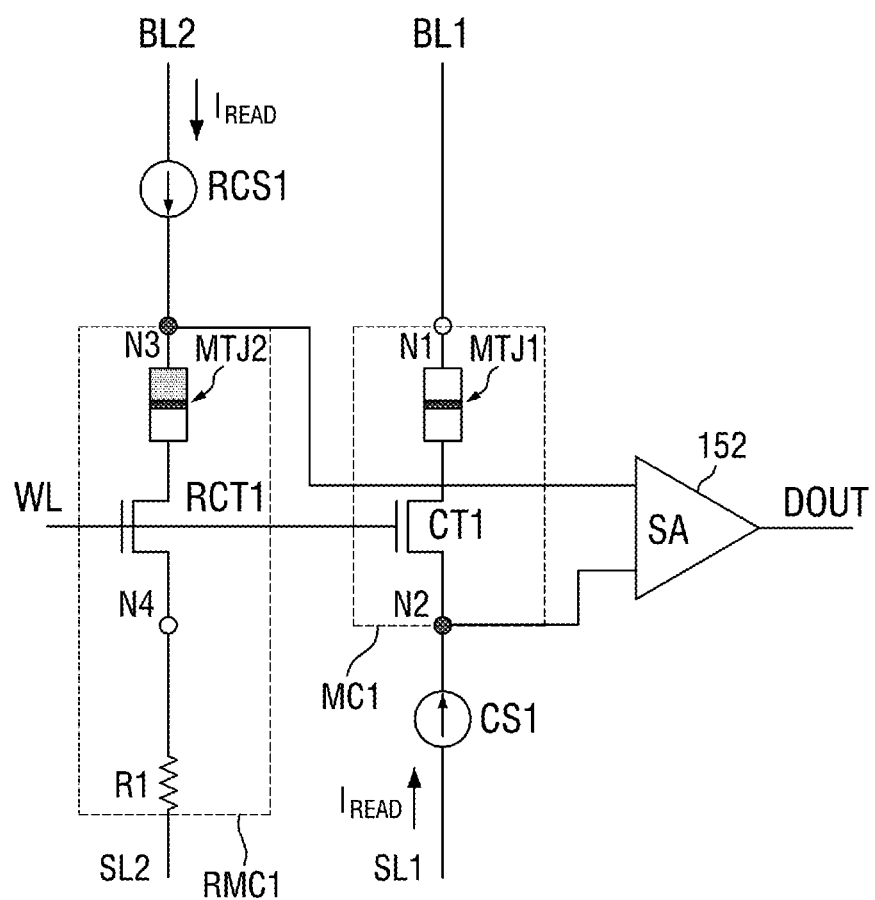
FIG. 8 illustrates a nonvolatile memory device according to an embodiment.
Figure 11:
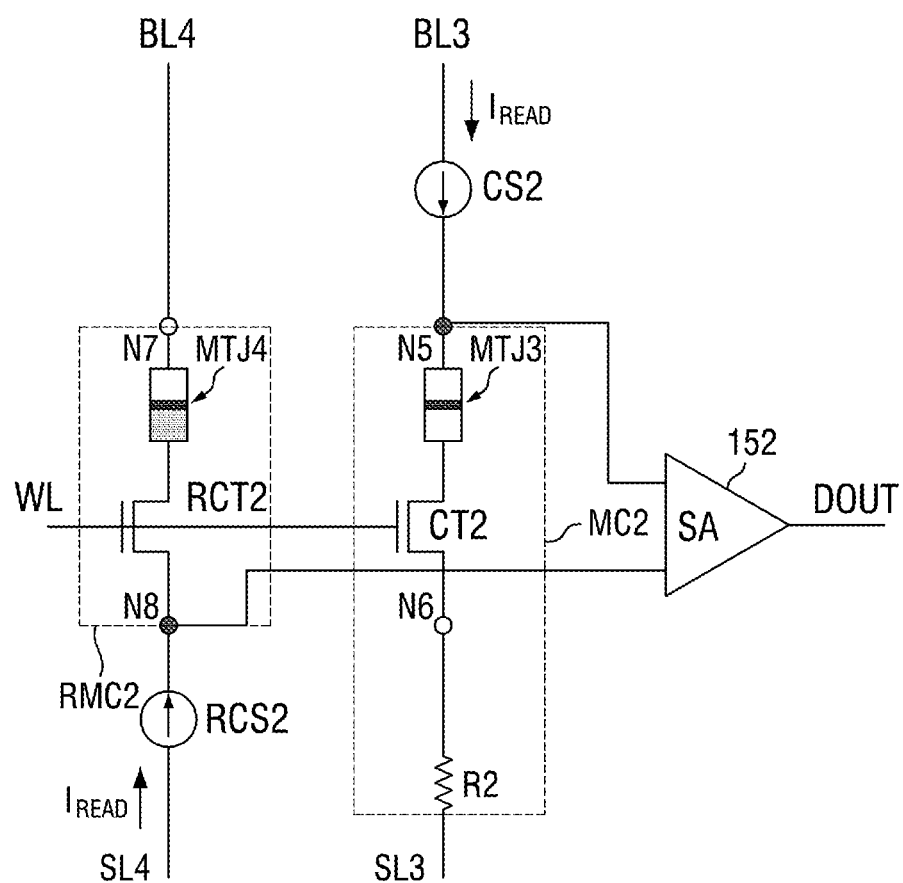
FIG. 11 illustrates a nonvolatile memory device according to an embodiment.

The sensing amplification circuit 150 may operate according to control of the control logic 180. The sensing amplification circuit 150 may include one or more sense amplifiers 152 (e.g., as shown in FIGS. 8 and 11), each of which sense data of a corresponding one of a memory cell MC that is connected to one of the bit lines selected by the bit line selection circuit 130 and to the word line selected by the address decoder circuit 120. The sense amplifier 152 may read data of the memory cells MC by sensing a current flowing through a selected bit line or a voltage applied to the selected bit line. The sensing amplification circuit 150 may output the read data to the data input and output circuit 160.

The data input and output circuit 160 may operate according to control of the control logic 180. The data input and output circuit 160 may deliver data received from an external source (e.g., host 200) of the memory device 100 to the write driver circuit 140, and may output data received from the sensing amplification circuit 150 to the external source.

The current source circuit 170 may provide a read current IREAD to the memory cell array 110. Specifically, the current source circuit 170 may provide the read current IREAD to memory cells MC to read data stored in normal memory cells MC in the normal memory cell regions 112, 116, and to a reference cell RMC connected to the same word line (the selected, activated word line) as the corresponding normal memory cells MC in the reference cell region 114.

The control logic 180 may control an overall operation of the nonvolatile memory device 100. For example, the control logic 180 may control the address decoder circuit 120, the bit line selection circuit 130, the write driver circuit 140, the sensing amplification circuit 150, the data input and output circuit 160, or the like. For example, the control logic 180 may control a value of the read current IREAD provided to the memory cell array 110 from the current source circuit 170, and a flow direction of the read current IREAD by transmitting a current control command CC to the current source circuit 170. The control logic 180 may operate in response to a command CMD and/or other control signals inputted from the outside (i.e., received from an external source such as host 200).

Referring back to the memory cell array 110, a reference cell RMC and a plurality of normal memory cells MC arranged in the same row may be jointly connected to one word line. That is, the reference cell RMC and the plurality of normal memory cells MC may be selected simultaneously by the activation of (enablement of) one word line of the plurality of word lines WL. In the detailed description, it is illustrated that the number of reference cells RMC selected at the same time as the plurality of normal memory cells MC is 1 or 2 (i.e., connected to the same activated word line), but the scope of the present invention is not limited thereto. The number of reference cells RMC selected at the same time and connected to the same word line as the plurality of normal memory cells MC may increase according to various design criteria of the memory device 100.

When the number of reference cells RMC selected at the same time as the plurality of normal memory cells MC is 1, the one reference cell RMC may be accessed to determine a value of data recorded in any one of the plurality of normal memory cells MC connected to the selected word line. Alternatively, when the number of reference cells RMC selected at the same time as the plurality of normal memory cells MC is 2, the two reference cells RMC may be set to have different resistance values and the two reference cells RMC may be accessed to determine a value of data recorded in any one of the plurality of normal memory cells MC connected to the selected word line. Herein, "the reference cell being accessed" may refer to the reference cell RMC activated by the selected word line to allow a read current IREAD to flow therethrough.

In addition, during an access operation, when a word line is selected, the same reference cell RMC may be accessed several times to determine a value of data recorded in another memory cell of the plurality of normal memory cells MC connected to the selected word line. Accordingly, when each of the plurality of normal memory cells MC selected at the same time as the reference cell RMC by one enabled word line is read (for example, consecutively, in sequence, or frequently), the number of times the reference cell RMC is accessed is increased in comparison to each of these normal memory cells MC. As a result, the reference cell RMC may receive a very high read stress in comparison to the normal memory cell MC, and thus stability of the reference cell MC may be degraded and there may be a problem that a read disturb rate (RDR) increases.

To address this problem, the current source circuit 170 may provide the read current IREAD to the memory cell array 110 under control of the control logic 180, as a method to minimize an RDR, which will be described in detail below with reference to FIGS. 6 to 11.

Figure 2:
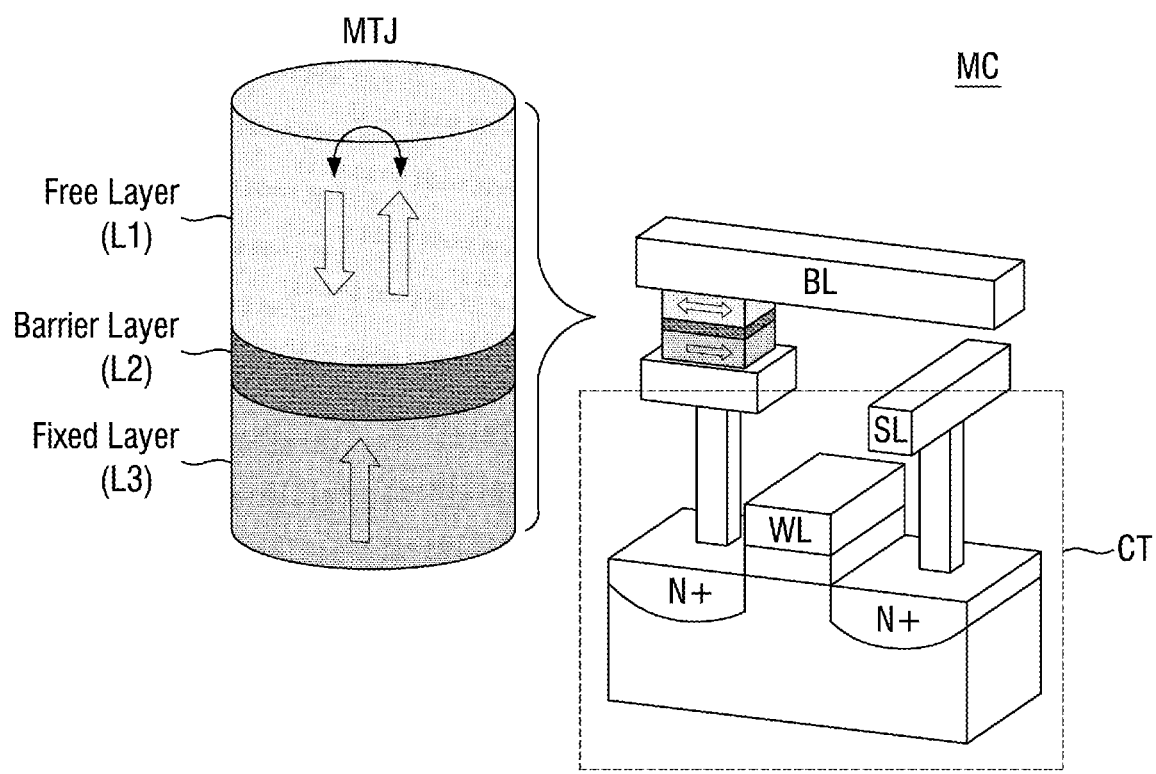
FIG. 2 is a illustrates a memory cell according to an embodiment.
Figure 3:
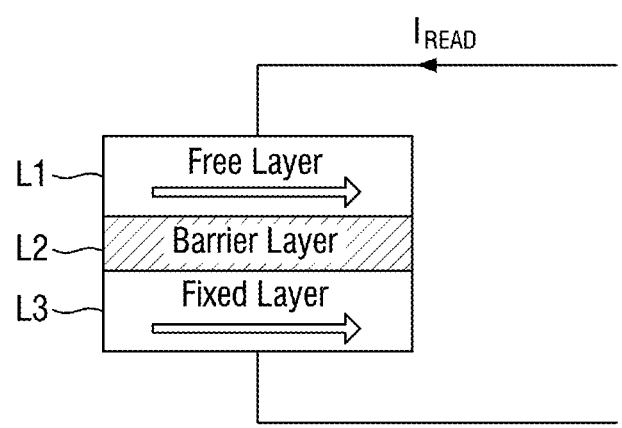
FIG. 3 is a diagram provided to explain data storage according to a magnetization direction in the structure of FIG. 2.
Figure 4:
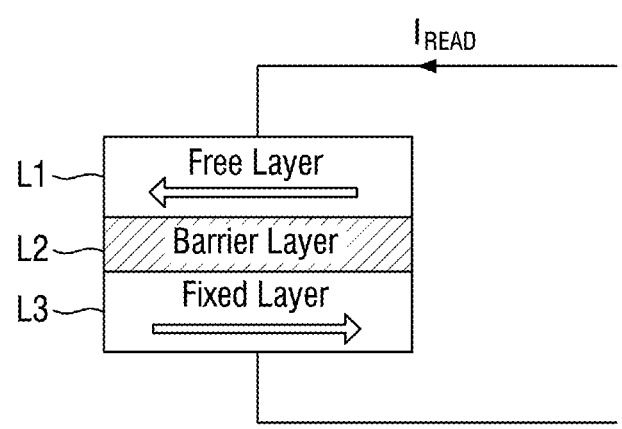
FIG. 4 is a diagram provided to explain data storage according to a magnetization direction in the structure of FIG. 2.

FIG. 2 illustrates a memory cell according to an embodiment. FIGS. 3 and 4 are views provided to explain data stored according to a magnetization direction in the structure of FIG. 2.

Note that the structure shown in FIG. 2 is shown as a memory cell MC for convenience of explanation, but explanation of the memory cell MC structure and operation may also apply to the structure and operation of a reference cell RMC of the disclosed embodiments.

The memory cell MC may include a variable resistor element MTJ (i.e., a variable resistor, having a magnetic tunnel junction structure in this example) and a cell transistor CT. A gate of the cell transistor CT may be connected to a word line WL. One electrode (e.g., one source/drain) of the cell transistor CT may be connected to a bit line BL through the variable resistor element MTJ. In addition, the other electrode (e.g., another source/drain) of the cell transistor CT may be connected to a source line SL. Although only one memory cell MC is illustrated, a plurality of memory cells (and reference cells RMC) may be provided, connected to corresponding ones of a plurality of bit lines BL, a plurality of word lines WL and a plurality of source lines SL (which may be patterned out of different conductive layers, respectively).

In an embodiment, an extension direction of the word line WL and an extension direction of the source line SL may be the same as each other, but the scope of the present invention is not limited thereto. In an embodiment, the extension direction of the word line WL and the extension direction of the bit line BL may be perpendicular to each other, but the scope of the present invention is not limited thereto.

The variable resistor element MTJ may include a free layer L1, a fixed layer L3, and a barrier layer L2 positioned therebetween. A magnetization direction of the fixed layer L3 may be fixed and a magnetization direction of the free layer L1 may be the same as the magnetization direction of the fixed layer L3 or the reverse direction according to its data storage condition. To fix the magnetization direction of the fixed layer L3, the variable resistor element MTJ may further include an anti-ferromagnetic layer.

In an embodiment, the free layer L1 may include a material having a changeable magnetization direction. The magnetization direction of the free layer L1 may be changed by an electrical signal or a magnetic field provided from the outside or inside of the memory cell MC. The free layer L1 may be formed of a ferromagnetic material including at least one of cobalt (Co), iron (Fe), and nickel (Ni). For example, the free layer L1 may be formed of at least one selected from FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO and $Y_3Fe_5O_{12}$.

The barrier layer L2 may have a thickness thinner than a spin diffusion distance. The barrier layer L2 may be formed of a nonmagnetic material. For example, the barrier layer L2 may formed of one or more oxides selected from oxides of magnesium (Mg), titanium (Ti), aluminum (Al), magnesium-zinc (MgZn) and magnesium-boron (MgB), and nitrides of titanium (Ti) and vanadium (V).

The fixed layer L3 may have a magnetization direction fixed by the anti-ferromagnetic layer. In addition, the fixed layer L3 may be formed of a ferromagnetic material. For example, the fixed layer L3 may include at least one selected from CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12.

In an embodiment, the anti-ferromagnetic layer may be formed of an anti-ferromagnetic material. For example, the anti-ferromagnetic layer may be formed of at least one selected from PtMn, IrMn, MnO, MnS, MnTe, MnF2, FeCl2, FeO, CoCl2, CoO, NiCl2, NiO and Cr.

In a read operation of the memory cell MC, a voltage of logic high may be provided to the selected word line WL (activating/enabling this selected word line WL). In response to the voltage of the word line WL, the cell transistor CT of each of the normal memory cells MC and reference memory cells RMC connected to the selected word line WL may be turned on. For ease of explanation, the following description and FIG. 2 is in connection with a single memory cell MC, however, it will be appreciated that other memory cells MC connected to the selected word line WL may also be similarly read. A read current IREAD may be provided from the bit line BL to the source line SL or from the source line SL to the bit line BL (through the variable resistor element MTJ) to measure a resistance value of the variable resistor element MTJ. Data stored in the variable resistor element MTJ may be determined according to the measured resistance value.

A resistance value of the variable resistor element MTJ may vary according to a magnetization direction of the free layer L1. When the read current IREAD is provided to the variable resistor element MTJ, a data voltage according to a resistance value of the variable resistor element MTJ may be generated on the bit line BL and output to a corresponding sense amplifier of the sense amplifier circuit 150. Since the magnitude of the read current IREAD is much smaller than the magnitude of a write current, it is common that the magnetization direction of the free layer L1 is not changed by the read current IREAD.

Referring to FIG. 3, in an embodiment, the magnetization direction of the free layer L1 and the magnetization direction of the fixed layer L3 in the variable resistor element MTJ may be parallel (p) to each other. In this case, the variable resistor element MTJ may have a low resistance value Rp (Rp denoting such resistance in this case). In this case, data of the memory cell may be determined as the binary value of '0,' for example.

On other hand, referring to FIG. 4, in an embodiment, the magnetization direction of the free layer L1 of the variable resistor element MTJ may be anti-parallel (ap) (e.g., opposite) to the magnetization direction of the fixed layer L3. In this case, the variable resistor element MTJ may have a high resistance value Rap (Rap denoting such resistance in this case). In this case, data may be determined as the binary value of '1,' for example.

Although FIG. 2 depicts that the free layer L1 and the fixed layer L3 of the variable resistor element MTJ are horizontal magnetic elements providing horizontal magnetization directions, the scope of the present invention is not limited thereto. In another embodiment, the free layer L1 and the fixed layer L3 may be provided by using vertical magnetic elements providing vertical magnetization directions.

Figure 5:
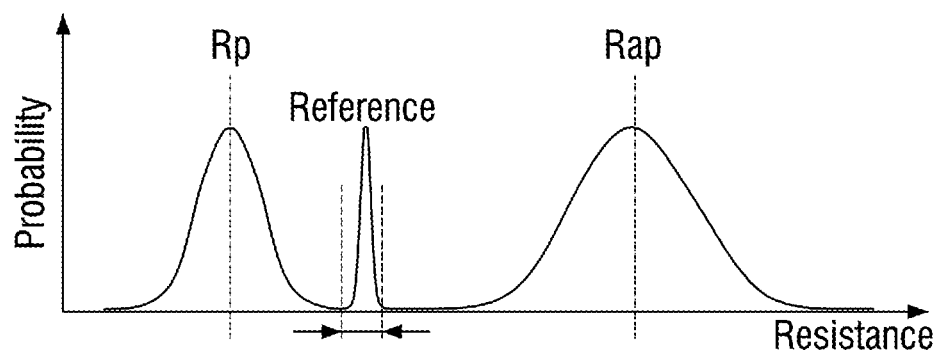
FIG. 5 is illustrates a relationship between a reference resistance value and programmed resistances of memory cells according to an embodiment.

FIG. 5 illustrates a relationship between a reference resistance value and programmed resistances of memory cells according to an embodiment.

Referring to FIG. 5, a reference resistance value Reference may be provided to be a resistance between a first resistance value Rp and a second resistance value Rap to determine data "0" and data "1." The reference resistance value Reference may be set by programming (writing) to a reference memory cell RMC to program a resistance value of a variable resistor element MTJ of the reference memory cell RMC with a first resistance value Rp or a second resistance value Rap. Herein, the first resistance value Rp corresponds to a resistance value of the variable resistor element MTJ of the memory cell MC (and reference memory cell RMC) when the magnetization direction of the free layer L1 and the magnetization direction of the fixed layer L3 in the variable resistor element MTJ are parallel (p) to each other, and the second resistance value Rap corresponds to a resistance value of the variable resistor element MTJ of the memory cell MC (and reference memory cell RMC) when the magnetization direction of the free layer L1 of the variable resistor element MTJ is anti-parallel (ap) to the magnetization direction of the fixed layer L3. It should be appreciated that FIG. 5 (as well as FIGS. 7 and 10) illustrate a probability of resistances that may be programmed as the resistance of the memory cell MC (corresponding to either Rp or Rap) and that may be provided as the resistance value Reference when setting the same in the memory device. Similar variations are shown with respect to FIGS. 7 and 10. Thus, reference to each of these resistances (e.g., corresponding to Rp, Rap, and Reference) will be understood to correspond to an acceptable range of resistance values that represent a corresponding programming state of a memory cell MC or a corresponding state of a reference memory cell RMC.

FIGS. 6 to 11 are provided to explain exemplary structure and operation of a nonvolatile memory device according to various embodiments of the invention. It should be appreciated that the disclosed embodiments may be used as alternative implementations of nonvolatile memory device 100 or may be used together in the same nonvolatile memory device 100 or may be used together with other reference memory cells RMC. For example, a single word line WL may have several reference memory cells RMC of the same type or of different types connected thereto to which the resistance values of memory cells MC (connected to the same word line WL) are compared to determine the resistance values of the memory cells MC.

Figure 6:
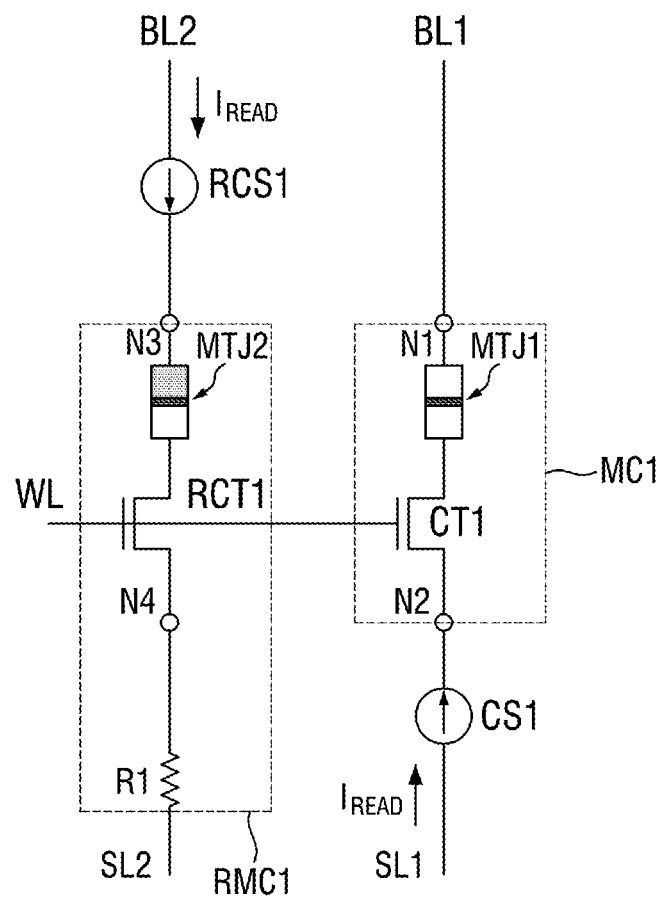
FIG. 6 illustrates a nonvolatile memory device according to an embodiment.

Referring to FIG. 6, a memory cell MC1 includes a first variable resistor element MTJ1 and a cell transistor CT1. The first variable resistor element MTJ1 may have one end connected to a first node N1 and the other end connected to a second node N2 through the cell transistor CT1. In this example, the first variable resistor element MTJ1 has one end connected to a first bit line BL1, and the other end connected to a first source line SL1 through the cell transistor CT1.

A reference cell RMC1 includes a second variable resistor element MTJ2, a reference cell transistor RCT1 and a resistance R1 (e.g., a first resistor). The second variable resistor element MTJ2 may have one end (e.g., a fixed layer end) connected to a third node N3 and the other end (e.g., a free layer end) connected to a fourth node N4 through the reference cell transistor RCT1 and resistance R1. In this example, the second variable resistor element MTJ2 has one end connected to a second bit line BL2, and the other end connected to a second source line SL2 through the reference cell transistor RCT1 and resistance R1.

Gates of the cell transistor CT1 of the memory cell MC1 and the reference cell transistor RCT1 of the reference cell RMC1 are connected to a word line WL. Thus, the memory cell MC1 and the reference cell RMC1 are jointly connected to the same word line.

As described above with reference to FIG. 1, when each of the plurality of normal memory cells MC selected at the same time as the reference cell RMC1 by one enabled word line WL is read (for example, consecutively, in sequence, or frequently), the reference cell RMC1 may receive a very high read stress, and as a result, stability of the reference cell RMC1 may be degraded and there may be a problem that an RDR increases.

To solve this problem, the control logic 180 may control the current source circuit 170, such that a direction of a first read current IREAD flowing in the memory cell MC1 and a direction of a second read current IREAD flowing in the reference cell RMC1 are opposite to each other. The direction of the first and second read currents may correspond to the direction of current flow from the corresponding bit line and corresponding source line connected to the memory cell MC1 or reference cell RMC1. The direction of the first and second read currents may flow in opposite directions with respect to the word line WL to which the memory cell MC1 and reference cell RMC1 are connected (e.g., in directions opposite to each other when the first and second read currents flow through the channels of the cell transistor CT1 and reference cell transistor RCT1—see FIG. 2, e.g.—that are formed under the word line WL to which the memory cell MC1 and reference cell RMC1 are connected.)

Herein, the first read current IREAD may correspond to a current that is provided to the memory cell MC1 to read the memory cell MC1, and the second read current IREAD may correspond to a current that is provided to the reference cell RMC1 to read the memory cell MC1, and the first read current IREAD and the second read current IREAD may have the same value, but the scope of the present invention is not limited hereto (e.g., the first read current and the second read current may have different values).

The second variable resistor element MTJ2 of the reference cell RMC1 shown in FIG. 6 may have a first resistance value Rp. That is, this is the case in which a magnetization direction of a free layer L1 and a magnetization direction of a fixed layer L3 in the second variable resistor element MTJ2 are parallel (p) to each other.

When the second variable resistor element MTJ2 has the first resistance value Rp, the control logic 180 may control the current source circuit 170, such that the first read current IREAD is provided to the memory cell MC1 to flow from the second node N2 to the first node N1, and the second read current IREAD is provided to the reference cell RMC1 to flow from the third node N3 to the fourth node N4.

In other words, the control logic 180 may control the current source circuit 170, such that the first read current IREAD flows through the memory cell MC1 from the first source line SL1 to the first bit line BL1, and the second read current IREAD flows through the reference cell RMC1 from the second bit line BL2 to the second source line SL2. Accordingly, since the magnetization direction of the free layer L1 and the magnetization direction of the fixed layer L3 are maintained as being parallel to each other, the second variable resistor element MTJ2 may maintain the first resistance value Rp and prevent RDR of the reference cell RMC1.

To achieve this, the current source circuit 170 may include a first current source CS1 to provide the first read current IREAD to the memory cell MC1 through the second node N2, and a first reference current source RCS1 to provide the second read current IREAD to the reference cell RMC1 through the third node N3. In addition, when the second variable resistor element MTJ2 has the first resistance value Rp, the current source circuit 170 may enable the first current source CS1 and the first reference current source RCS1 under control of the control logic 180.

The reference cell RMC1 of the memory device 100 according to an embodiment of the present disclosure further includes a resistance R1 (e.g., a first resistor which provides a fixed resistance). The resistance R1 has one end connected to the fourth node N4 and the other end connected to the second source line SL2. It should be appreciated that the series connection of the elements forming reference cell RMC1 may be provided in a different order than that shown in FIGS. 6 and 8. For example, the arrangement of second variable resistor element MTJ2, the reference cell transistor RCT1 and resistance R1 may be provided in any order between the second bit line BL2 and the second source line SL2. Similarly, first reference current source RCS1 and first current source CS1 may be provided at different locations within the respective series connection of the elements (e.g., as shown in FIGS. 6 and 8) provided between the corresponding bit line (BL1, BL2) and corresponding source line (SL1, SL2).

Figure 7:
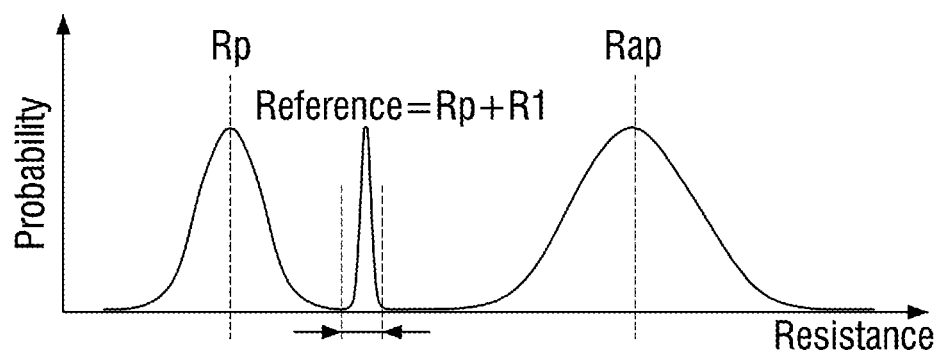
FIG. 7 illustrates a relationship between a reference resistance value and programmed resistances of memory cells according to an embodiment.

Referring to FIG. 7, the resistance value of the reference cell RMC1 is a sum of the first resistance value Rp of the second variable resistor element MTJ2 and the resistance R1. That is, the resistance value of the reference cell RMC1 is a value shifted from the first resistance value Rp to a reference resistance value Reference. Accordingly, the nonvolatile memory device 100 according to an embodiment of the present disclosure may determine the data value DOUT of the memory cell MC1 as '0' or '1' by using the reference resistance value Reference (e.g., comparing the resistance of memory cell MC1 with the reference resistance value Reference).

Referring to FIG. 8, the nonvolatile memory device 100 according to an embodiment includes a sense amplifier 152. Sense amplifier 152 may be one of a plurality of sense amplifiers 152 that form sense amplifier circuit 150 (each being selectively connected to a corresponding BL in response to a column address decoded by address decoder 120, as described herein). In a read operation, the cell transistor CT1 and the reference cell transistor RCT1 gated to the word line WL (e.g., having their gates formed by and/or directly connected word line WL) may be turned on simultaneously.

When flow directions of the memory cell MC1 and the reference cell RMC1 are opposite to each other, and the read current IREAD of the same value flows, the sense amplifier 152 may compare a voltage of the second node N2 and a voltage of the third node N3, and may determine a data value DOUT of the memory cell MC1 as '0' or '1.' For example, the sense amplifier 152 may compare a voltage of the second bit line BL2 and a voltage of the first source line SL1, and may determine the data value DOUT of the memory cell MC1 as '0' or '1.' It will be appreciated that the voltages of the second node N2 and the third node N3 may correspond to (e.g., be substantially proportional to) the resistances of the memory cell MC1 and the reference cell RMC1, respectively.

By reading the memory cell MC1 in this method, an RDR for the reference cell RMC1 can be reduced and a sensing margin can be improved.

Figure 9:
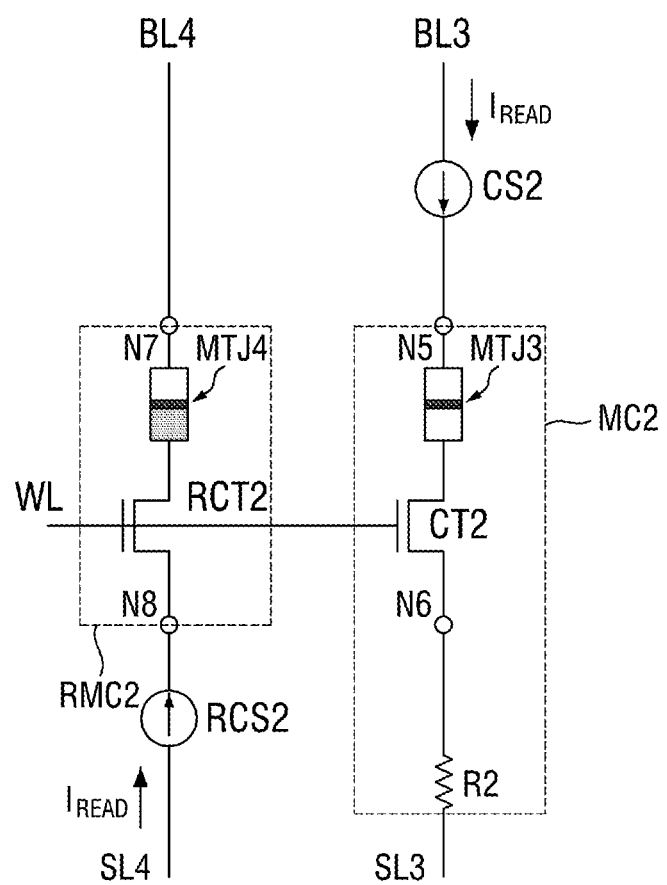
FIG. 9 is illustrates a nonvolatile memory device according to an embodiment.
Figure 10:
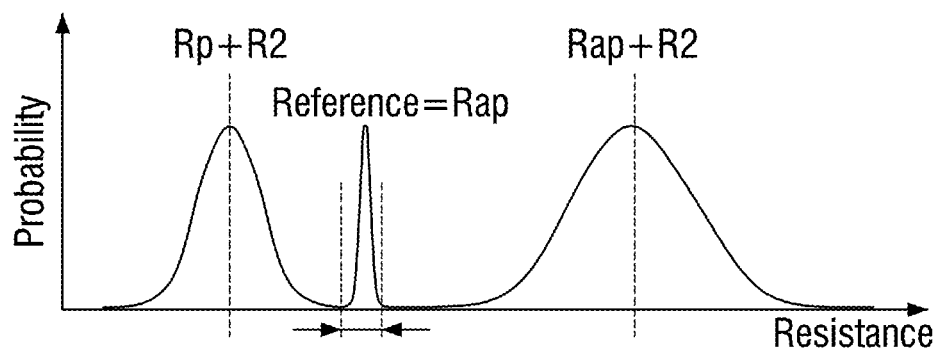
FIG. 10 illustrates a relationship between a reference resistance value and programmed resistances of memory cells according to an embodiment.

FIGS. 9 and 10 are views provided to explain a nonvolatile memory device according to an embodiment.

Referring to FIG. 9, a memory cell MC2 includes a first variable resistor element MTJ3, a cell transistor CT2 and a resistance R2 (e.g., a second resistor). The first variable resistor element MTJ3 may have one end connected to a first node N5 and the other end connected to a second node N6 through the cell transistor CT2 and resistance R2. In addition, the first variable resistor element MTJ3 may have one end connected to a first bit line BL3, and the other end connected to a first source line SL3 through the cell transistor CT2 and resistance R2.

A reference cell RMC2 includes a second variable resistor element MTJ4 and a reference cell transistor RCT2. The second variable resistor element MTJ4 may have one end connected to a third node N7 and the other end connected to a fourth node N8 through the reference cell transistor RCT2. In addition, the second variable resistor element MTJ4 may have one end connected to a second bit line BL4, and the other end connected to a second source line SL4 through the reference cell transistor RCT2.

Gates of the cell transistor CT2 of the memory cell MC2 and the reference cell transistor RCT2 of the reference cell RMC2 are connected to a word line WL. That is, the memory cell MC2 and the reference cell RMC2 are jointly connected to the same word line.

As described above with reference to FIG. 1, when each of the plurality of normal memory cells MC selected at the same time as the reference cell RMC2 by one enabled word line WL is read (for example, consecutively, in sequence, or frequently), the reference cell RMC2 may receive a very high read stress, and as a result, stability of the reference cell RMC2 may be degraded and there may be a problem that an RDR increases.

To solve this problem, the control logic 180 may control the current source circuit 170, such that a direction of a first read current IREAD flowing in the memory cell MC2 and a direction of a second read current IREAD flowing in the reference cell RMC2 are opposite to each other. The direction of the first and second read currents may correspond to the direction of current flow from the corresponding bit line and corresponding source line connected to the memory cell MC2 or reference cell RMC2. The direction of the first and second read currents may flow in opposite directions with respect to the word line WL to which the memory cell MC2 and reference cell RMC2 are connected (e.g., in directions opposite to each other when the first and second read currents flow through the channels of the cell transistor CT2 and reference cell transistor RCT2—see FIG. 2, e.g.—that are formed under the word line WL to which the memory cell MC2 and reference cell RMC2 are connected.)

Herein, the first read current IREAD may correspond to a current that is provided to the memory cell MC2 to read the memory cell MC2, and the second read current IREAD may correspond to a current that is provided to the reference cell RMC2 (to identify the reference resistance Reference of reference cell RMC2 to read the memory cell MC2), and the first read current IREAD and the second read current IREAD may have the same value, but the scope of the present invention is not limited hereto (e.g., the first and second read currents may be different from each other).

The second variable resistor element MTJ4 of the reference cell RMC2 shown in FIG. 9 may have a second resistance value Rap. That is, this is the case in which a magnetization direction of a free layer L1 and a magnetization direction of a fixed layer L3 in the second variable resistor element MTJ4 are anti-parallel (ap) to each other.

When the second variable resistor element MTJ4 has the second resistance value Rap, the control logic 180 may control the current source circuit 170, such that the first read current IREAD flows through the memory cell MC2 from the first node N5 to the second node N6, and the second read current IREAD flows through the reference cell RMC2 from the fourth node N8 to the third node N7.

In other words, the control logic 180 may control the current source circuit 170, such that the first read current IREAD flows through the memory cell MC2 from the first bit line BL3 to the first source line SL3, and the second read current IREAD flows through the reference cell RMC2 from the second source line SL4 to the second bit line BL4. Accordingly, since the magnetization direction of the free layer L1 and the magnetization direction of the fixed layer L3 are maintained as being anti-parallel to each other, the second variable resistor element MTJ4 may maintain the second resistance value Rap and prevent RDR of the reference cell RMC2.

To achieve this, the current source circuit 170 may include a second current source CS2 to provide the first read current IREAD to the memory cell MC2 through the first node N5, and a second reference current source RCS2 to provide the second read current IREAD to the reference cell RMC2 through the fourth node N8. In addition, when the second variable resistor element MTJ4 has the second resistance value Rap, the current source circuit 170 may enable the second current source CS2 and the second reference current source RCS2 under control of the control logic 180.

The memory cell MC2 of the memory device 100 according to an embodiment of the present disclosure further includes a resistance R2 (e.g., a second resistor that provides a fixed resistance). The resistance R2 has one end connected to the second node N6 and the other end connected to the second source line SL3. It should be appreciated that the series connection of the elements of the memory cell MC2 and the series connection of the elements of the reference cell RMC2 may be provided in a different order than that shown in FIG. 11. Similarly, second reference current source RCS2 and second current source CS2 may be provided at different locations within the respective series connection of the elements (e.g., as shown in FIGS. 9 and 11) provided between the corresponding bit line (BL3, BL4) and corresponding source line (SL3, SL4).

Referring to FIG. 10, since the second variable resistor element MTJ4 of the reference cell RMC2 is the second resistance value Rap and may correspond to the reference resistance value Reference. Accordingly, the nonvolatile memory device 100 according to an embodiment of the present disclosure may determine the data value DOUT of the memory cell MC2 as '0' or '1' by using the reference resistance value Reference (e.g., comparing the resistance of memory cell MC2—including the resistance of the first variable resistor element MTJ3 and resistance R2—with the reference resistance value Reference).

Referring to FIG. 11, the nonvolatile memory device 100 according to an embodiment may further include the sense amplifier 152. In a read operation, the cell transistor CT2 and the reference cell transistor RCT2 gated to the word line WL may be turned on simultaneously.

When flow directions of the memory cell MC2 and the reference cell RMC2 are opposite to each other, and the read current IREAD of the same value flows, the sense amplifier 152 may compare a voltage of the first node N5 and a voltage of the fourth node N8, and may determine a data value DOUT of the memory cell MC2 as '0' or '1.' In other words, the sense amplifier 152 may compare a voltage of the second source line SL4 and a voltage of the first bit line BL3, and may determine the data value DOUT of the memory cell MC2 as '0' or '1.' It will be appreciated that the voltages of the first node N5 and the fourth node N8 may correspond to (e.g., be substantially proportional to in some implementations) the resistances of the memory cell MC2 and the reference cell RMC2, respectively.

By reading the memory cell MC2 in this method, an RDR for the reference cell RMC2 can be reduced and a sensing margin can be improved.

Figure 12:
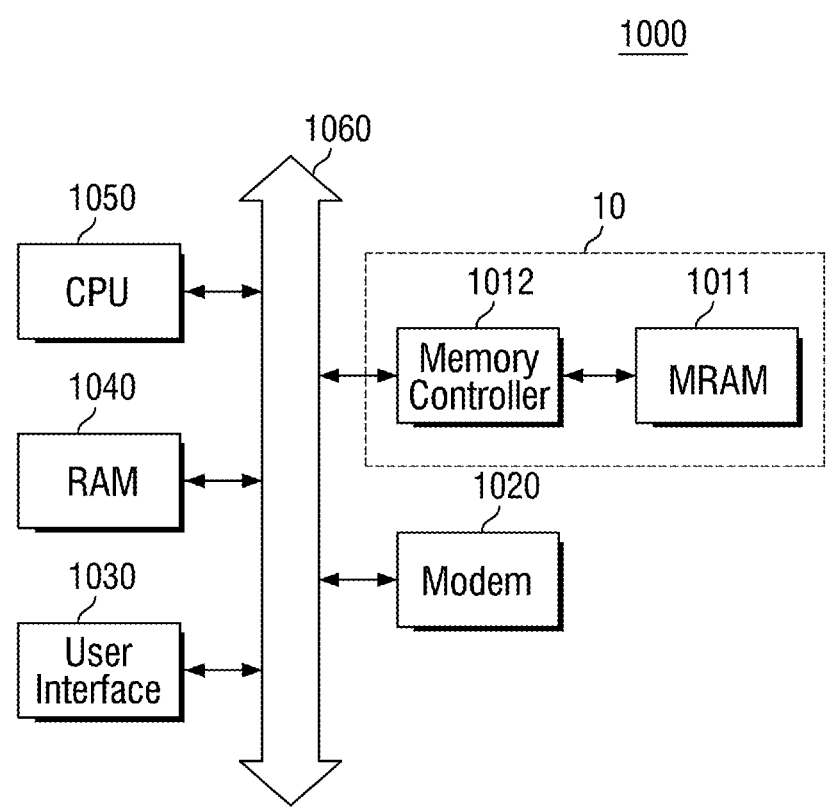
FIG. 12 illustrates a computing system according to an embodiment.

FIG. 12 illustrates an example of a computing system according to an embodiment.

Referring to FIG. 12, a memory device 1011 may be integrated in the computing system 1000. The computing system 1000 may include a memory system 10, a modem 1020, a user interface 1030, a RAM 1040, and a CPU 1050 which are electrically connected to a system bus 1060. The memory device 1011 may be an MRAM semiconductor chip including an STT-MRAM cell array, and the memory system 10 may be an MRAM system including one or more MRAM semiconductor chips. The STT-MRAM cell array of the memory device 1011 may be implemented with any of the embodiments described above. In addition, computing system 1000 may be implemented as an application chipset, a camera image processor (CIS), an input and output device.

In some embodiments, the computing system 1000 may correspond to a desktop computer, a server computer, a notebook computer, a tablet computer, a smartphone, a wearable device, or the like, but the scope of the present invention is not limited hereto.

In the present embodiment, the memory system 10 may include the memory device 1011 and a memory controller 1012. The memory device 1011 may store data processed by the CPU 1050 or data received from an external source. In this case, the memory device 1011 may be implemented by using any of the embodiments described above, such as with reference to FIGS. 1 to 11.

Exemplary embodiments of the present disclosure were explained hereinabove with reference to the drawings attached, but it should be understood that the present invention is not limited to the aforementioned exemplary embodiments, but may be fabricated in various different forms, and may be implemented by a person skilled in the art in other specific forms. Accordingly, it will be understood that the exemplary embodiments described above are only illustrative, and should not be construed as limiting.

What is claimed is:

1. A nonvolatile memory device comprising:
   a memory cell comprising a first series connection of a first variable resistor and a cell transistor;
   a reference cell comprising a second series connection of a second variable resistor and a reference cell transistor, the second variable resistor including a free layer and a fixed layer;
   a first current source configured to provide a first read current to the memory cell;
   a second current source configured to provide a second read current to the reference cell from the fixed layer to the free layer;
   a first word line,
   wherein gates of the cell transistor and the reference cell transistor are connected to the first word line, and
   wherein the first current source and the second current source are configured to provide the first read current and the second read current in directions that are opposite to each other with respect to the first word line; and
   a control logic circuit configured to control values of the first read current and the second read current and the first current source and the second current source to provide the first read current and the second read current in directions that are opposite to each other with respect to the first word line,
   wherein the reference cell comprises a series connection of the second variable resistor, the reference cell transistor and a first resistance to provide a reference resistance comprising a sum of the first resistance and a resistance of the second variable resistor.

2. The nonvolatile memory device of claim 1,
   wherein the first variable resistor and the cell transistor of the memory cell are connected between a first bit line and a first source line,
   wherein the second variable resistor and the reference cell transistor are connected between a second bit line and a second source line,
   wherein the first current source is configured to provide the first read current to flow through the memory cell from the first source line to the first bit line, and
   wherein the second current source is configured to provide the second read current to flow through the reference cell from the second bit line to the second source line.

3. The nonvolatile memory device of claim 2, wherein the first current source is connected between the first source line and the memory cell at a first node and the second current source is connected between the second bit line and the reference cell at a second node.

4. The nonvolatile memory device of claim 3, further comprising
   a sense amplifier configured to compare a voltage of the first node and a voltage of the second node to determine a data value of the memory cell.

5. The nonvolatile memory device of claim 1,
   wherein the first variable resistor and the cell transistor of the memory cell are connected between a first bit line and a first source line,
   wherein the second variable resistor and the reference cell transistor are connected between a second bit line and a second source line,
   wherein the first current source is configured to provide the first read current to flow through the memory cell from the first bit line to the first source line, and
   wherein the second current source is configured to provide the second read current to flow through the reference cell from the second source line to the second bit line.

6. The nonvolatile memory device of claim 5, wherein the first current source is connected between the first bit line and the memory cell at a first node and the second current source is connected between the second source line and the reference cell at a second node.

7. The nonvolatile memory device of claim 6, further comprising
   a sense amplifier configured to compare a voltage of the first node and a voltage of the second node to determine a data value of the memory cell.

8. The nonvolatile memory device of claim 1, further comprising
a memory cell array comprising a first normal memory cell region comprising the memory cell, and a reference cell region comprising the reference cell.

9. The nonvolatile memory device of claim 8,
wherein the memory cell array comprises a second normal memory cell region, and
wherein the reference cell region is arranged between the first normal memory cell region and the second normal memory cell region.

10. A nonvolatile memory device comprising:
a memory cell comprising a first variable resistor having one end connected to a first bit line, and another end connected to a first source line through a cell transistor;
a reference cell comprising a second variable resistor having one end connected to a second bit line, and another end connected to a second source line through a reference cell transistor, the second variable resistor including a free layer and a fixed layer;
a first current source configured to provide a first read current to the memory cell with a current flow direction from the first source line to the first bit line; and
a second current source configured to provide a second read current to the reference cell with a current flow direction from the second bit line to the second source line and from the fixed layer to the free layer,
wherein the reference cell comprises a series connection of the second variable resistor, the reference cell transistor and a first resistance to provide a reference resistance comprising a sum of the first resistance and a resistance of the second variable resistor.

11. The nonvolatile memory device of claim 10,
wherein the second variable resistor of the reference cell comprises a free layer, a fixed layer and a barrier layer positioned between the fixed layer and the free layer, and
wherein the second variable resistor is programmable to cause a magnetization direction of the free layer and a magnetization direction of the fixed layer to be parallel and provide a first resistance value.

12. The nonvolatile memory device of claim 10, further comprising
a sense amplifier configured to compare a voltage of the first source line and a voltage of the second bit line to determine a data value of the memory cell.

13. The nonvolatile memory device of claim 10, further comprising
a control logic circuit configured to control values of the first read current and the second read current and the first current source and the second current source to provide the first read current and the second read current in directions that are opposite to each other with respect to a first word line connected to a gate of the cell transistor and a gate of the reference cell transistor.

14. A nonvolatile memory device comprising:
a memory cell comprising a first variable resistor having one end connected to a first bit line, and another end connected to a first source line through a cell transistor; and
a reference cell comprising a second variable resistor having one end connected to a second bit line, and another end connected to a second source line through a reference cell transistor, the second variable resistor including a free layer and a fixed layer;
a first current source configured to provide a first read current to the memory cell in a current flow direction from the first bit line to the first source line; and
a second current source configured to provide a second read current to the reference cell in a current flow direction from the second source line to the second bit line and from the fixed layer to the free layer,
wherein the memory cell comprises a series connection of the first variable resistor, the cell transistor and a first resistance to provide a memory cell resistance value comprising a sum of the first resistance and a resistance of the first variable resistor.

15. The nonvolatile memory device of claim 14,
wherein the second variable resistor of the reference cell comprises a free layer, a fixed layer and a barrier layer positioned between the fixed layer and the free layer, and
wherein the second variable resistor is programmable to cause a magnetization direction of the free layer and a magnetization direction of the fixed layer to be different from each other and has a second resistance value.

16. The nonvolatile memory device of claim 14, further comprising
a sense amplifier configured to compare a voltage of the first bit line and a voltage of the second source line to determine a data value of the memory cell.

17. The nonvolatile memory device of claim 14, further comprising
a control logic circuit configured to control values of the first read current and the second read current and the first current source and the second current source to provide the first read current and the second read current in directions that are opposite to each other with respect to a first word line connected to a gate of the cell transistor and a gate of the reference cell transistor.

* * * * *